United States Patent
Sze

(10) Patent No.: US 7,321,141 B2
(45) Date of Patent: Jan. 22, 2008

(54) IMAGE SENSOR DEVICE AND MANUFACTURING METHOD THEREOF

(75) Inventor: Jhy-Jyi Sze, Tai-Nan (TW)

(73) Assignee: United Microelectronics Corp., Hsin-Chu (TW)

( * ) Notice: Subject to any disclaimer, the term of this patent is extended or adjusted under 35 U.S.C. 154(b) by 99 days.

(21) Appl. No.: 11/379,057

(22) Filed: Apr. 18, 2006

(65) Prior Publication Data

US 2007/0243676 A1  Oct. 18, 2007

(51) Int. Cl.
*H01L 27/148* (2006.01)
*H01L 21/00* (2006.01)

(52) U.S. Cl. .................. 257/233; 257/292; 257/396; 257/446; 257/461; 257/E31.084; 438/75; 438/221; 438/237; 438/425; 438/443; 438/981

(58) Field of Classification Search ........... 257/233, 257/291–292, 395–396, 446, 461, E31.084; 438/57, 60, 73, 75, 221, 237, 425, 443, 981
See application file for complete search history.

(56) References Cited

U.S. PATENT DOCUMENTS

| 5,760,458 | A | * | 6/1998 | Bergemont et al. ......... 257/588 |
| 6,278,145 | B1 | | 8/2001 | Kato |
| 6,287,886 | B1 | | 9/2001 | Pan |
| 6,462,365 | B1 | * | 10/2002 | He et al. .................. 257/292 |
| 6,545,302 | B2 | * | 4/2003 | Han ........................ 257/222 |
| 6,583,484 | B2 | * | 6/2003 | Pan et al. .................. 257/461 |
| 6,946,352 | B2 | | 9/2005 | Yaung |
| 7,122,876 | B2 | * | 10/2006 | Wu et al. .................. 257/510 |
| 2005/0045925 | A1 | * | 3/2005 | Yoshida et al. ............ 257/291 |
| 2006/0017830 | A1 | | 1/2006 | Hsieh |
| 2007/0004076 | A1 | * | 1/2007 | Lee et al. .................. 438/57 |

FOREIGN PATENT DOCUMENTS

| TW | 1229456 | 3/2005 |
| TW | 1239644 | 9/2005 |

* cited by examiner

*Primary Examiner*—Zandra V. Smith
*Assistant Examiner*—Toniae M Thomas
(74) *Attorney, Agent, or Firm*—Winston Hsu

(57) ABSTRACT

A semiconductor substrate is provided on which a plurality of shallow trench isolations (STI) defining a plurality of active areas are formed. The active areas comprise a photo sensing region, and a plurality of photodiodes are formed in each photo sensing region. Then a local oxidation of silicon isolation (LOCOS) layer is formed by performing a LOCOS process. Thereafter a plurality of gates are respectively formed in each active area, where the gates partially overlap the LOCOS layer. Finally doped regions are formed in the semiconductor substrate where the gate does not cover the LOCOS layer.

28 Claims, 17 Drawing Sheets

IMAGE SENSOR DEVICE AND MANUFACTURING METHOD THEREOF

BACKGROUND OF THE INVENTION

1. Field of the Invention

This invention relates to an image sensor device and a manufacturing method thereof, and more particularly, to a complementary metal-oxide semiconductor (CMOS) image sensor having pinned photodiode (PPD).

2. Description of the Prior Art

Complementary metal-oxide semiconductor (CMOS) image sensors are manufactured by using conventional semiconductor techniques, which have the advantages of low cost and small size. Furthermore, the CMOS image sensors have high quantum efficiency and low read-out noise. Therefore CMOS image sensor has become a prevailing image technology and replaces the charge-coupled device (CCD) over time.

A typical CMOS image sensor comprises a photodiode for sensing light. Light current from the photodiode induced by light represents a signal, whereas dark current generated from the photodiode in the absence of light represents noise. The photodiode processes signal data by using the value of the signal-to-noise ratio. Excessive dark current lowers the dynamic range of the CMOS image sensor because there is insufficient ability to distinguish between the light and dark currents. Therefore, minimizing dark current in the photodiode is a key device optimization step in CMOS image sensor fabrication.

Generally, dark current is related to surface defects, plasma damage, and wafer impurity, etc., which result from the manufacturing process. For example, after forming the photodiode of a CMOS image sensor, the surface of the photodiode tends to be damaged during the plasma etching process, and thus dark current occurs. Therefore, the prior art has provided methods to lower the occurrence of dark current. Please refer to FIG. 1, which is a schematic drawing of a conventional CMOS image sensor. As shown in FIG. 1, a CMOS image sensor 100 comprises a photodiode having a p-well 102 and an N-type heavily doped region 104. The photodiode is electrically connected to a gate 108 by an N-type lightly doped region 106, which constructs a field effect transistor with the gate 108 and another N-type lightly doped region 110. The prior art further provides a field oxide (FOX) 112, such as a local oxidation of silicon isolation (LOCOS) layer, to be a dielectric material for isolating the photodiode from other devices. The FOX 112 also covers part of the photodiode for protecting its surface from being damaged during the manufacturing processes.

Please refer to FIG. 2, which is a CMOS image sensor as disclosed in U.S. Pat. No. 6,462,365. Patent '365 provides a CMOS image sensor 200 having its photodiode 202 mostly covered by a field oxide, such as a LOCOS layer 204; and the rest of it is covered by a gate 206. Because the photodiode 202 is entirely covered by the LOCOS layer 204 and the gate 206, the surface defects resulting from manufacturing processes are prevented and thus dark current caused by the surface defects is reduced. In addition, '365 also disclosed that the LOCOS layer 204 can be replaced by a shallow trench isolation (STI).

However, the LOCOS layer formed by a LOCOS process consumes a larger surface, and occupies valuable space on a wafer when being used to isolate the photodiode from other device, which therefore reduces integration and increases cost. Comparing with the LOCOS layer, the alternative STI has more complicated processes than the LOCOS layer has, such as etching trench, filling oxidation layer, and planarization process. It is also further necessary to consider the substrate where the photodiode located may be damaged while etching the trenches.

SUMMARY OF THE INVENTION

Therefore the present invention provides an image sensor and a manufacturing method thereof to effectively protect the surface of the image sensor and to reduce dark current.

According to the claimed invention, a method of manufacturing image sensor is provided. The method comprises steps of providing a substrate and forming a plurality of shallow trench isolations (STIs) for defining and isolating a plurality of active areas, each of which comprises a photo sensing region. The steps also comprise performing a local oxidation of silicon (LOCOS) process to form a LOCOS layer on the photo sensing region, forming a gate of a transistor partially overlapping the LOCOS layer in each active area, and forming a plurality of doped regions in the substrate.

According to the claimed method, the present invention also provides an image sensor comprising a substrate, a shallow trench isolation (STI) for defining and electrically isolating an active area on the substrate, a photodiode formed in the active area on the substrate, a local oxidation of silicon (LOCOS) layer covering the surface of the photodiode for protecting the surface of the photodiode, a gate formed in the active area on the substrate and partially overlapping the LOCOS layer, and a doped region formed in the substrate.

Because the STI and the LOCOS layer are formed separately, and the STI is used to electrically isolate the active areas from each other while the LOCOS layer is used to be a protection layer for the photodiode and the gate insulator of the gate, the present invention provides an image sensor having lower occurrence of dark current without influencing the demand for the integration. Moreover, because the gate insulator has different thickness in accordance with the claimed invention, a mechanism which effectively turns off the gate is provided to further reduce the occurrence of dark current.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
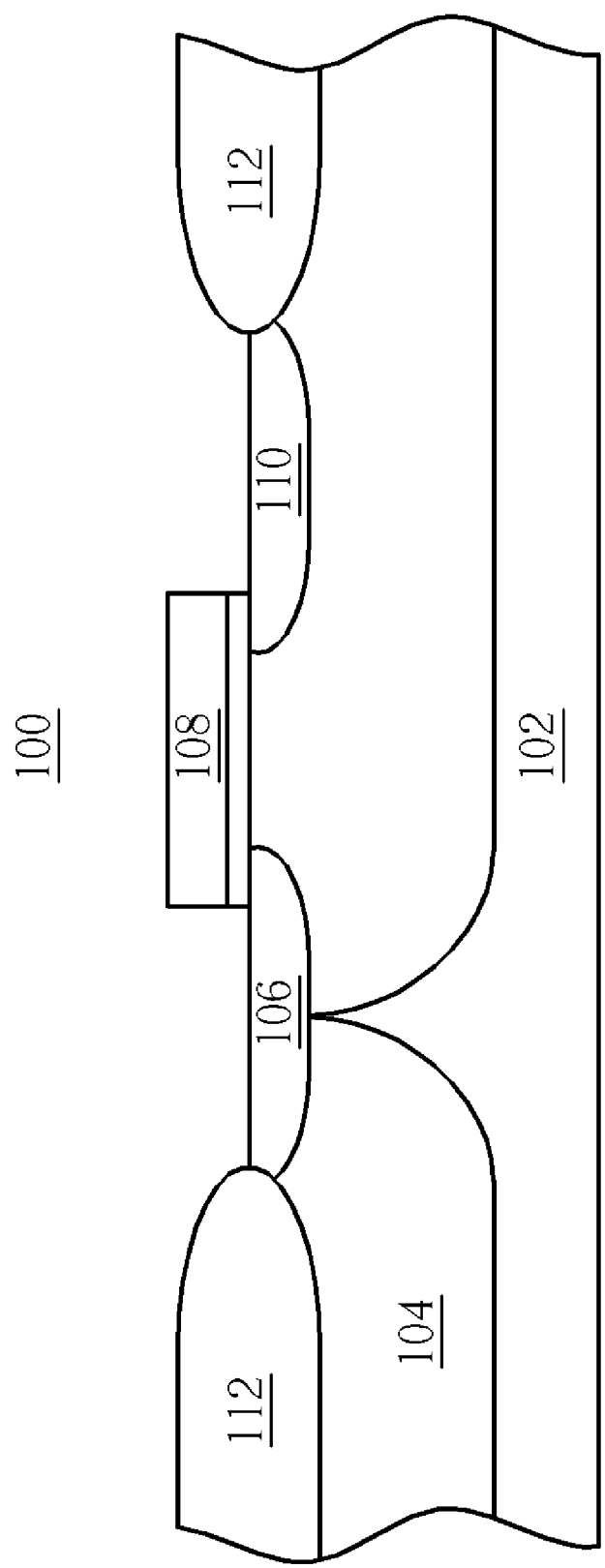
FIG. 1 is a schematic drawing of a conventional CMOS image sensor.
Figure 2:
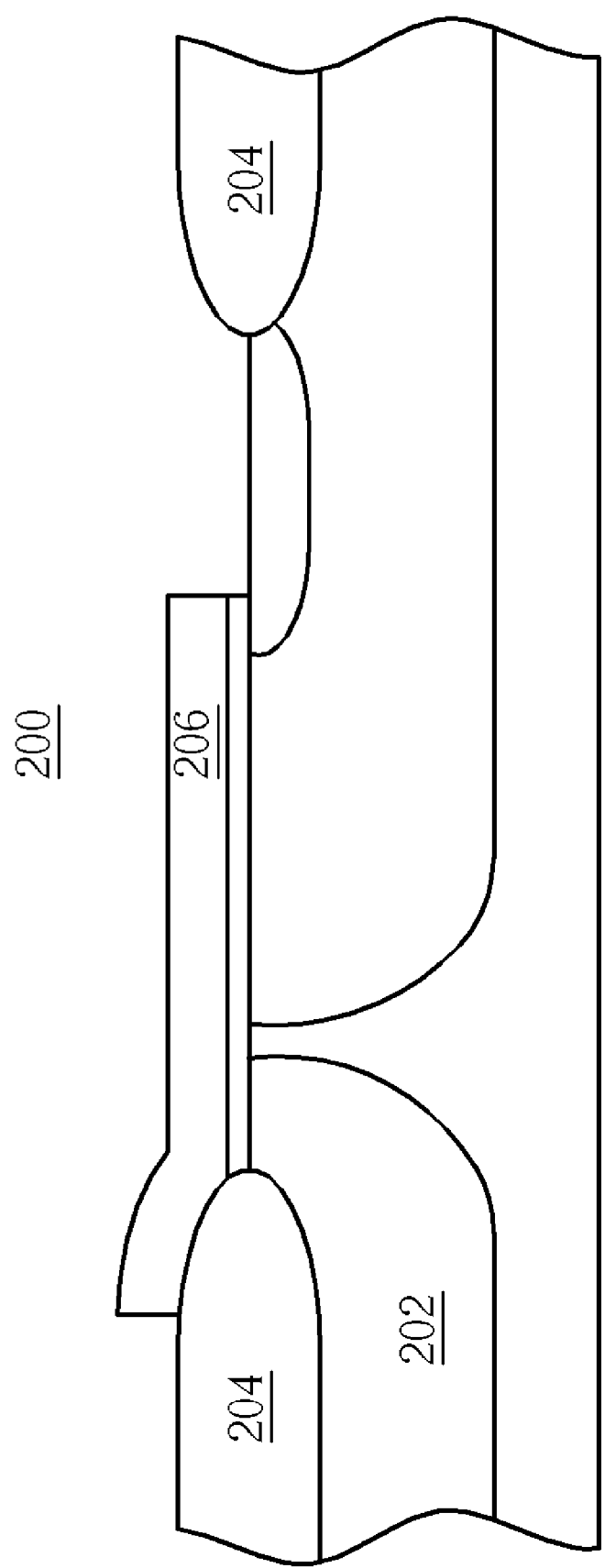
FIG. 2 is a CMOS image sensor as disclosed in U.S. Pat. No. 6,462,365.
Figure 3:
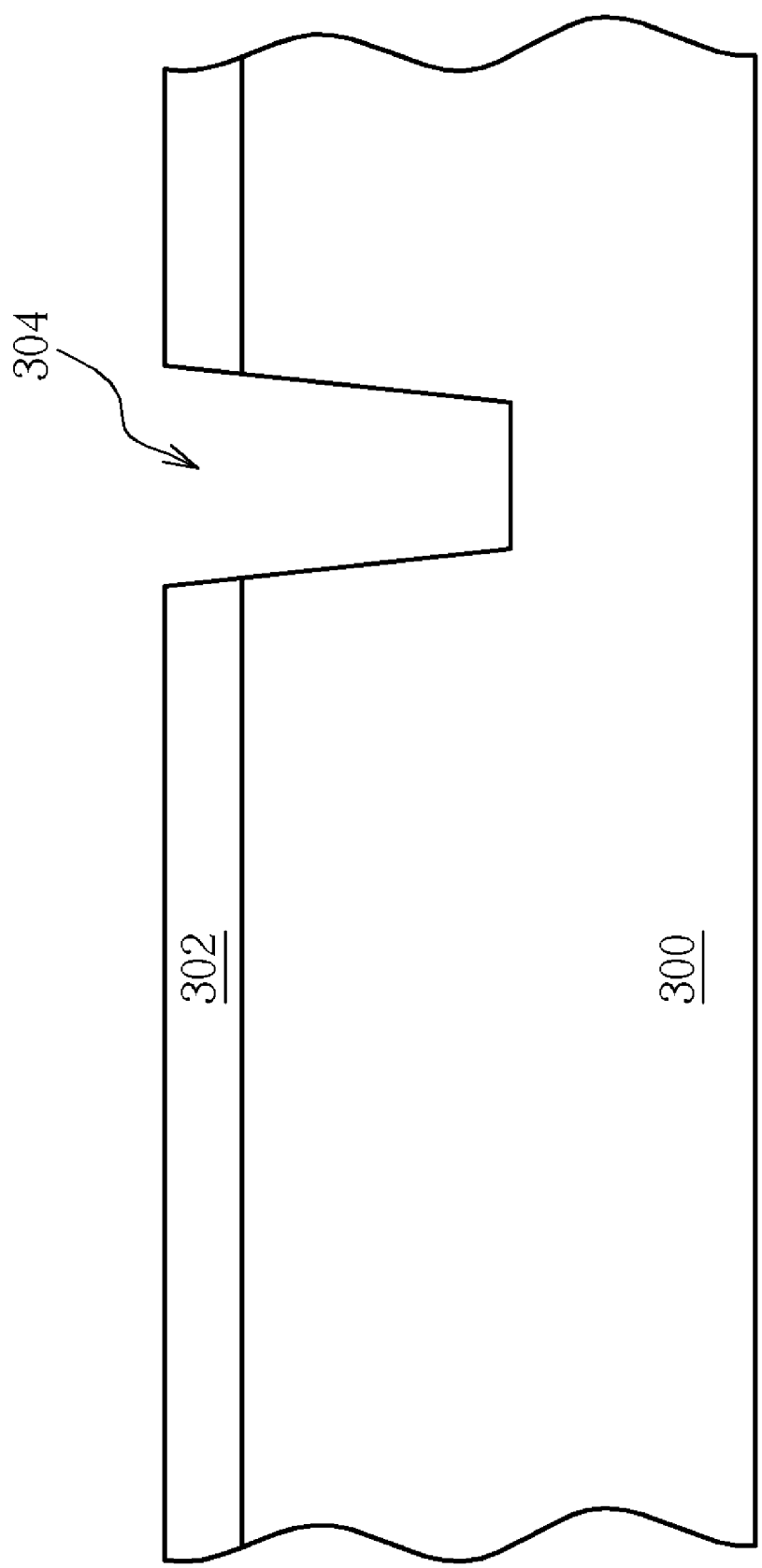
FIGS. 3-10 are schematic drawings illustrating the method for manufacturing an image sensor according to one embodiment in the present invention.

Please refer to FIGS. 3-10 which are schematic drawings illustrating the method for manufacturing an image sensor according to one embodiment in the present invention. As shown in FIG. 3, a substrate 300 is first provided and a patterned hard mask layer 302 such as a composite layer comprising a pad oxide layer and a silicon nitride layer is formed on the surface of the substrate 300 for defining a position of a shallow trench isolation (STI) 310 (shown in FIG. 5). Then a dry etching process is performed to etch the substrate 300 through the patterned hard mask layer 302 and to form a shallow trench 304 having a depth in a range of 3000-4000 angstroms.

Figure 4:
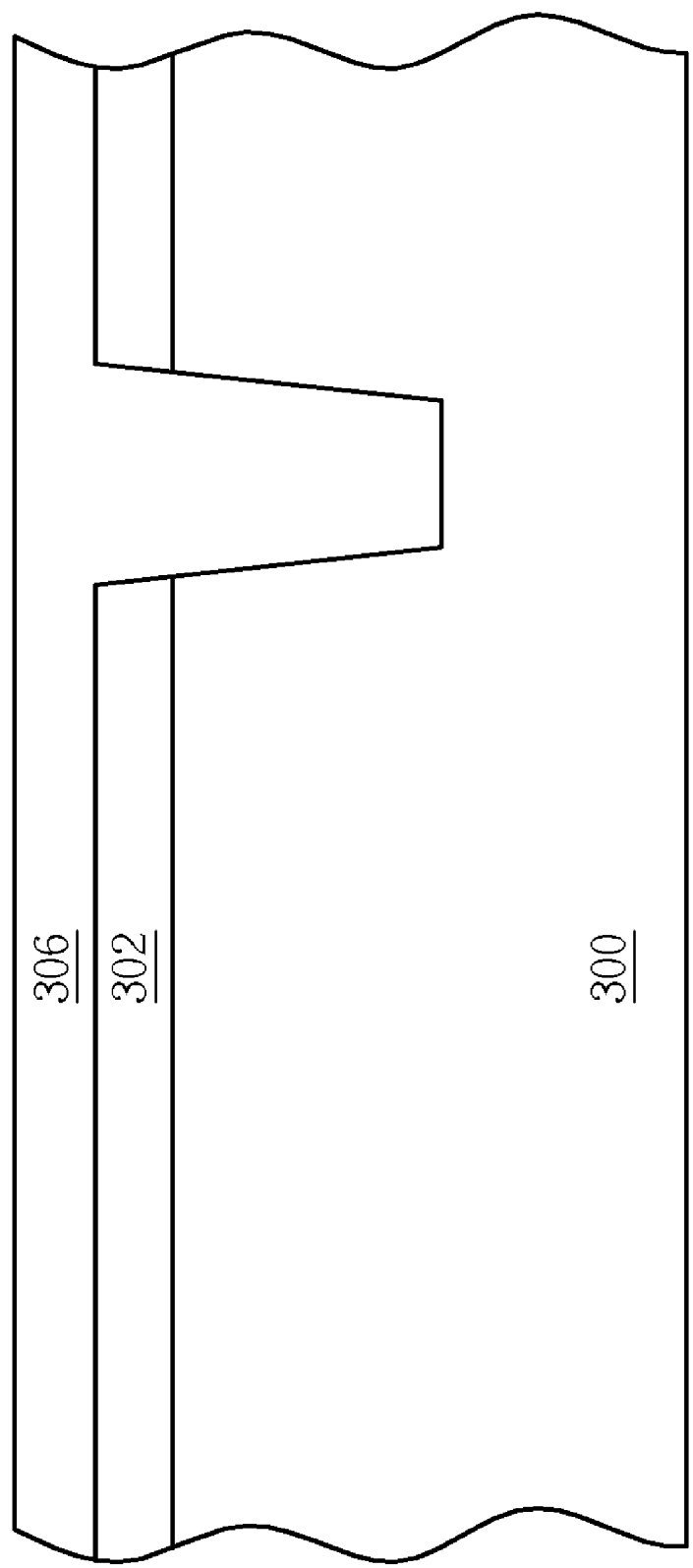
Figure 5:
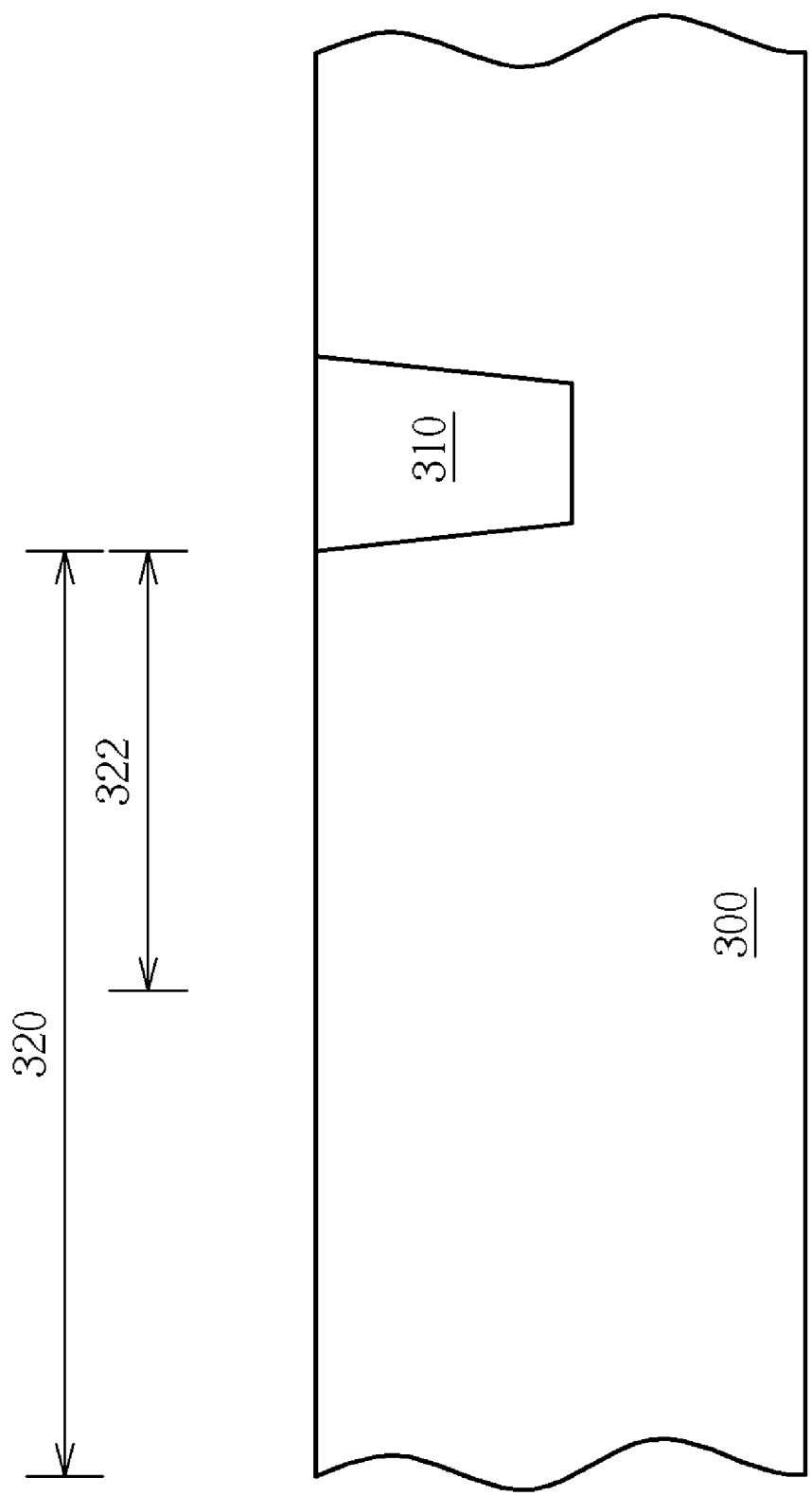

Please refer to FIGS. 4-5. Then a thermal oxidation process, a spin-on process, or a chemical vapor deposition (CVD) process is performed to form a dielectric layer 306 filling the shallow trench 304 on the substrate 300. And a chemical mechanical polishing (CMP) method is performed as a planarization process to remove the dielectric layer 306 from the substrate 300 and obtain a substantially even surface. And thus the STI 310 is formed after removing the patterned hard mask layer 302. Meanwhile, the STI 310 is used to define an active area 320 which has a photo sensing region 322.

Figure 6:
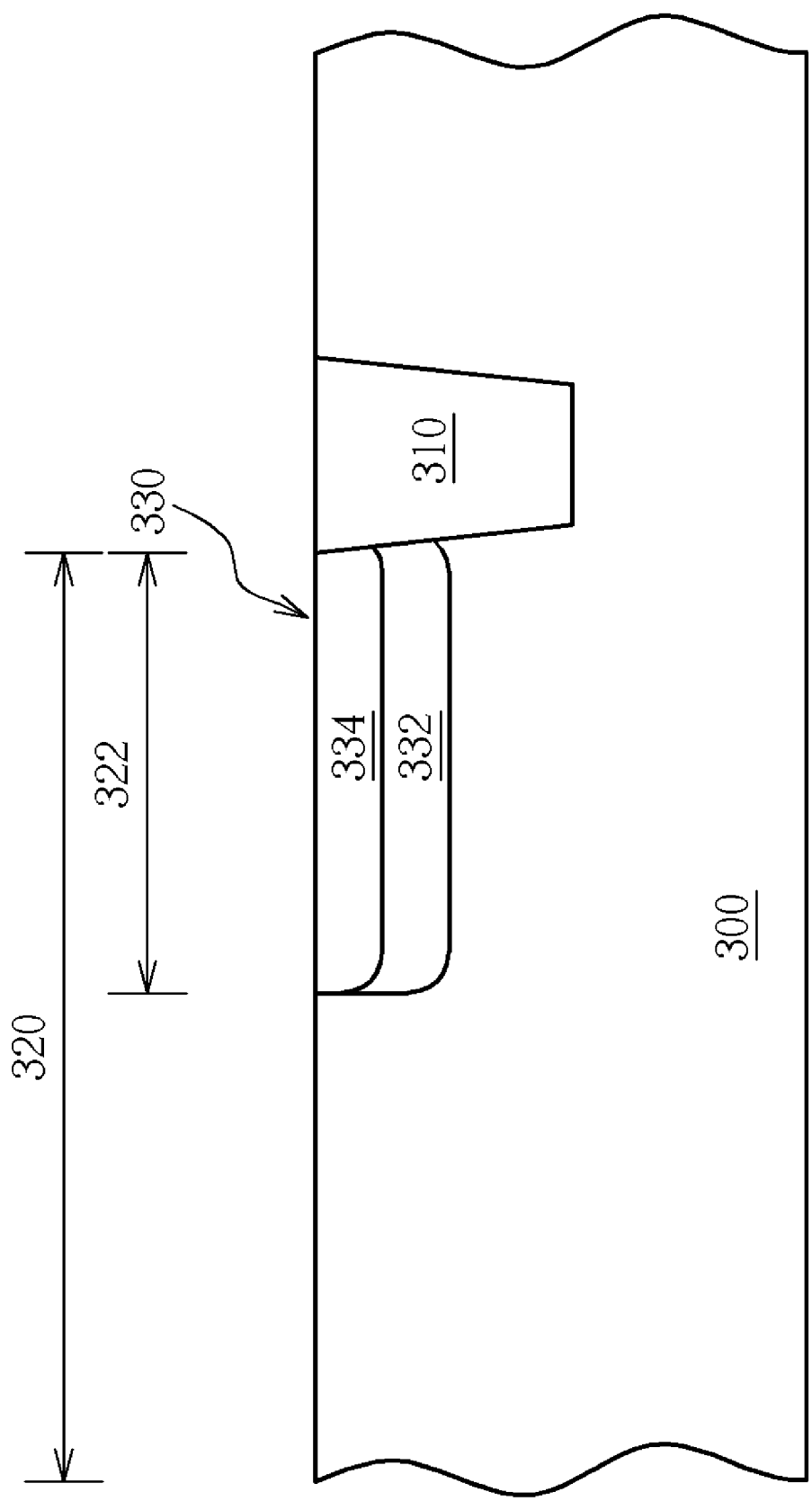

Please refer to FIG. 6. Then ion implantations are sequentially performed to form a lightly doped layer 332 and a heavily doped layer 334 thereon in the photo sensing region 322, and thus a pinned photodiode 330 is formed.

Figure 7:
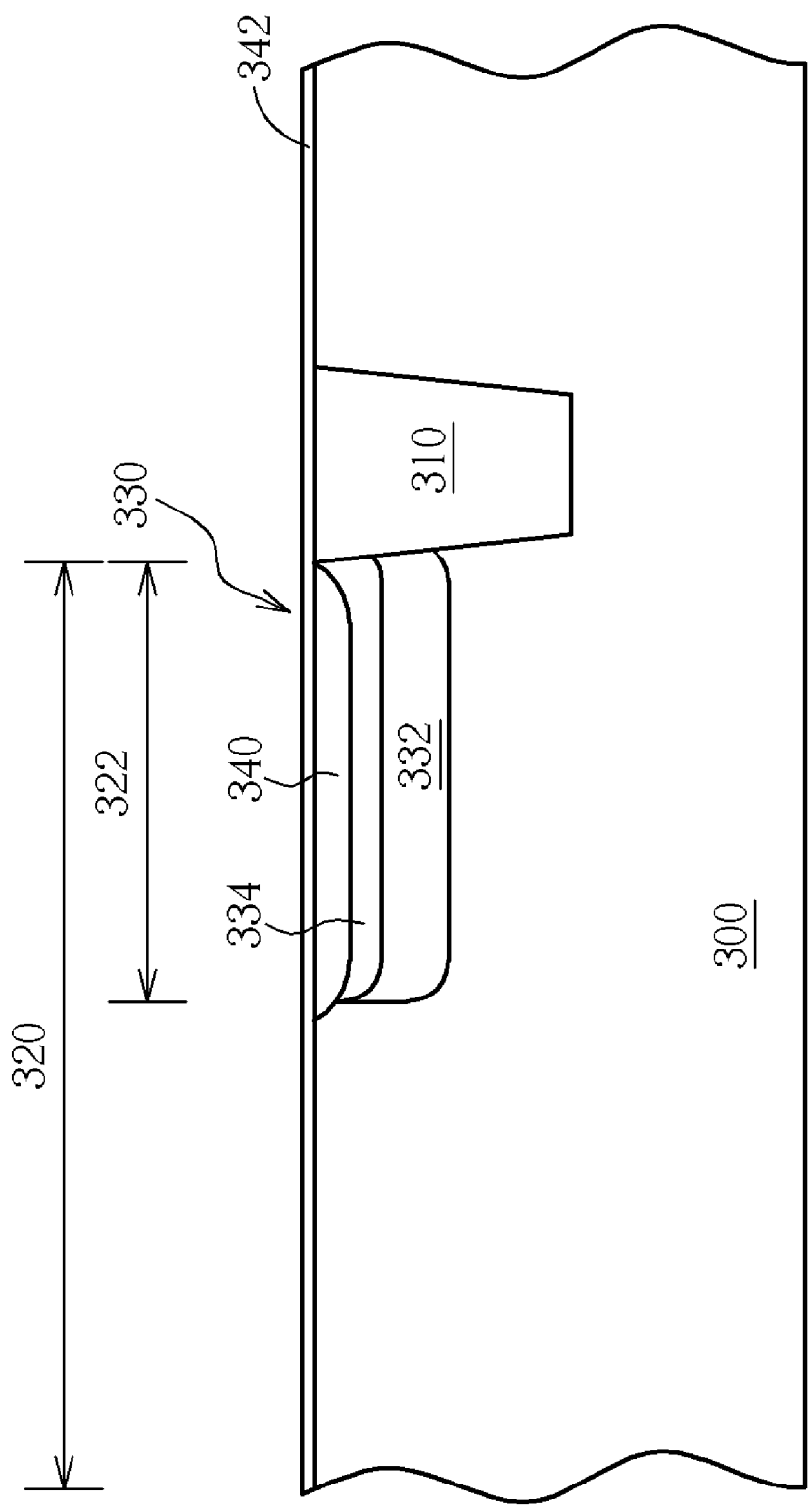

Please refer to FIG. 7. After forming the photodiode 330, another patterned hard mask layer (not shown) such as a composite layer comprising a pad oxide layer and a silicon nitride layer is formed on the substrate 300 to define a position of a LOCOS layer 340. Then a LOCOS process is performed to form the LOCOS layer 340 on the surface of the photodiode 330. It is noteworthy that the LOCOS layer 340 covering the photodiode 330 as its protection layer has a thickness in a range of 100-1000 angstroms. After removing the patterned hard mask layer (not shown), a dielectric layer such as an oxidation layer 342 is formed on the substrate 300 by a thermal oxidation process or a CVD process. In addition, a planarization process such as a CMP process or an etching process is selectively performed for removing impurities from the substrate 300 to obtain an oxidation layer 342 having better quality, for decreasing the thickness of the LOCOS layer 340 to improve the sensibility of the photodiode 330, and for polishing the LOCOS layer 340 to obtain an even surface.

Figure 8:
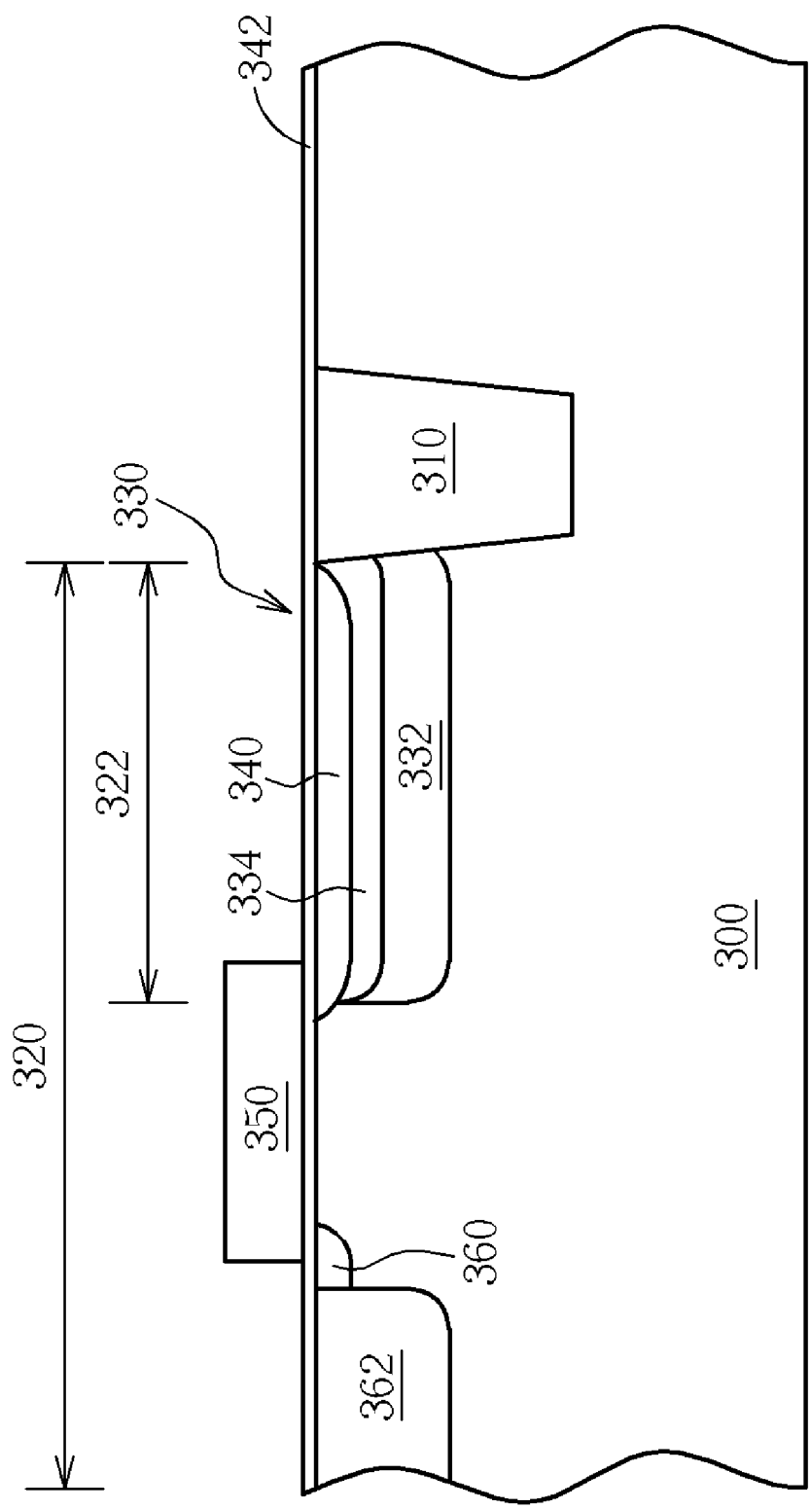

Please refer to FIG. 8. A gate 350 of a transistor partially overlapping the LOCOS layer 340 is then formed on the substrate 300. The gate 350 is used as a mask in ion implantation processes which respectively forms a lightly doped region 360 and a heavily doped region 362 in the substrate 300 where the gate 350 does not cover the LOCOS layer 340.

Figure 9:
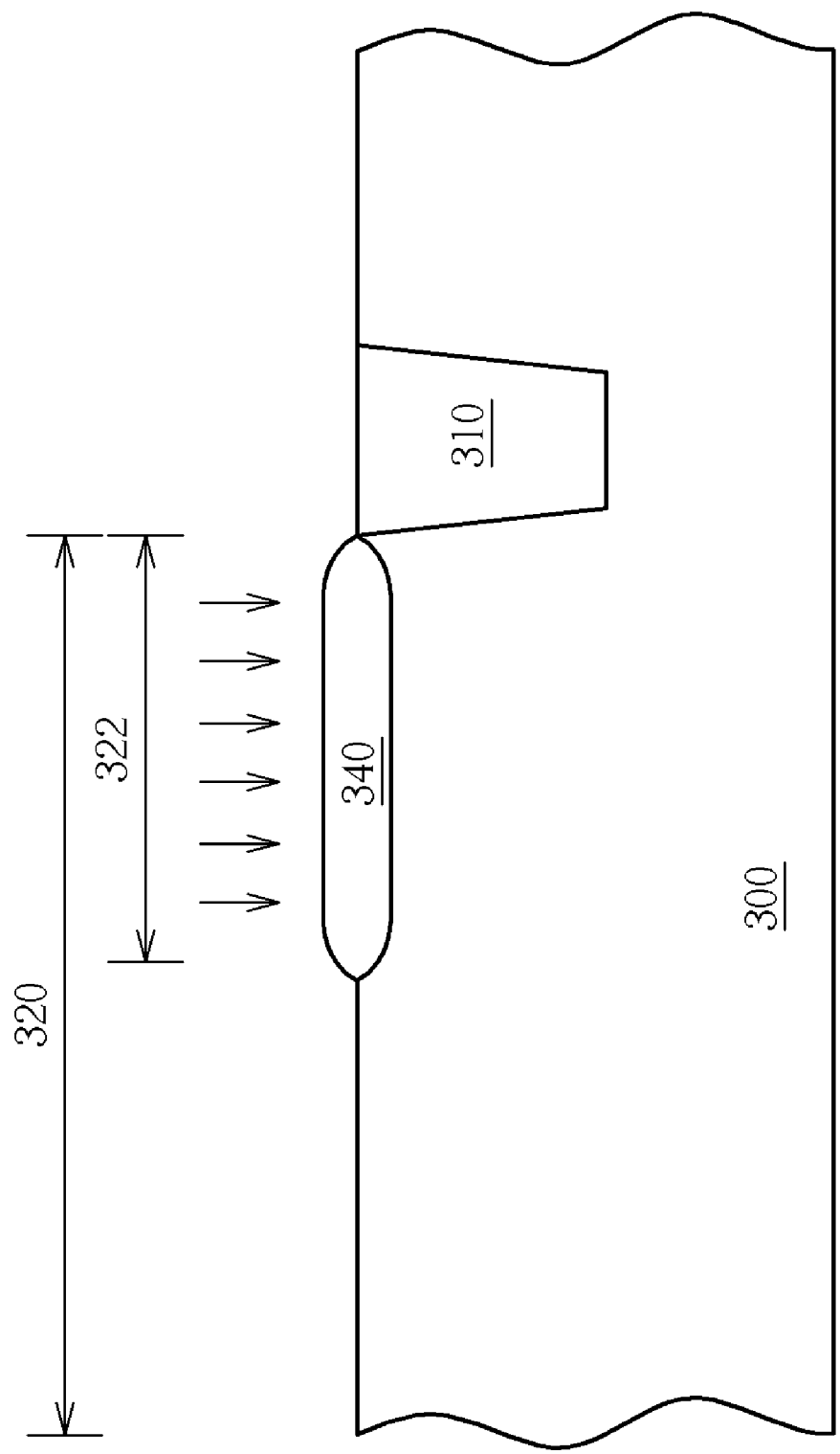

It is noteworthy that although the steps of forming the photodiode 350 are performed before the LOCOS process in this embodiment, it also can be performed after the LOCOS process and before forming the gate 350, as shown in FIG. 9. In addition, please refer to FIG. 10, the steps of forming the photodiode 330 can be performed simultaneously with the steps of forming the lightly doped region 360 and the heavily doped region 362, or after those steps.

Because the LOCOS layer 340 is used to be the protection layer of the photodiode 330, the surface of the photodiode 330 will not be damaged when forming the gate 350, which partially overlaps the LOCOS layer 340. Therefore dark current resulting from the damaged surface in the processes such as plasma etching is obviously reduced. In addition, because the LOCOS layer 340 and the oxidation layer 342 partially overlapping the gate 350 are used as the gate insulator and the LOCOS layer 340 is thicker than the oxidation layer 342, the gate insulator has different thickness. When the voltage applied to the gate 350 is smaller than the threshold voltage ($V_{th}$), the gate 350 is turned off immediately. Therefore dark current is further effectively reduced.

Figure 11:
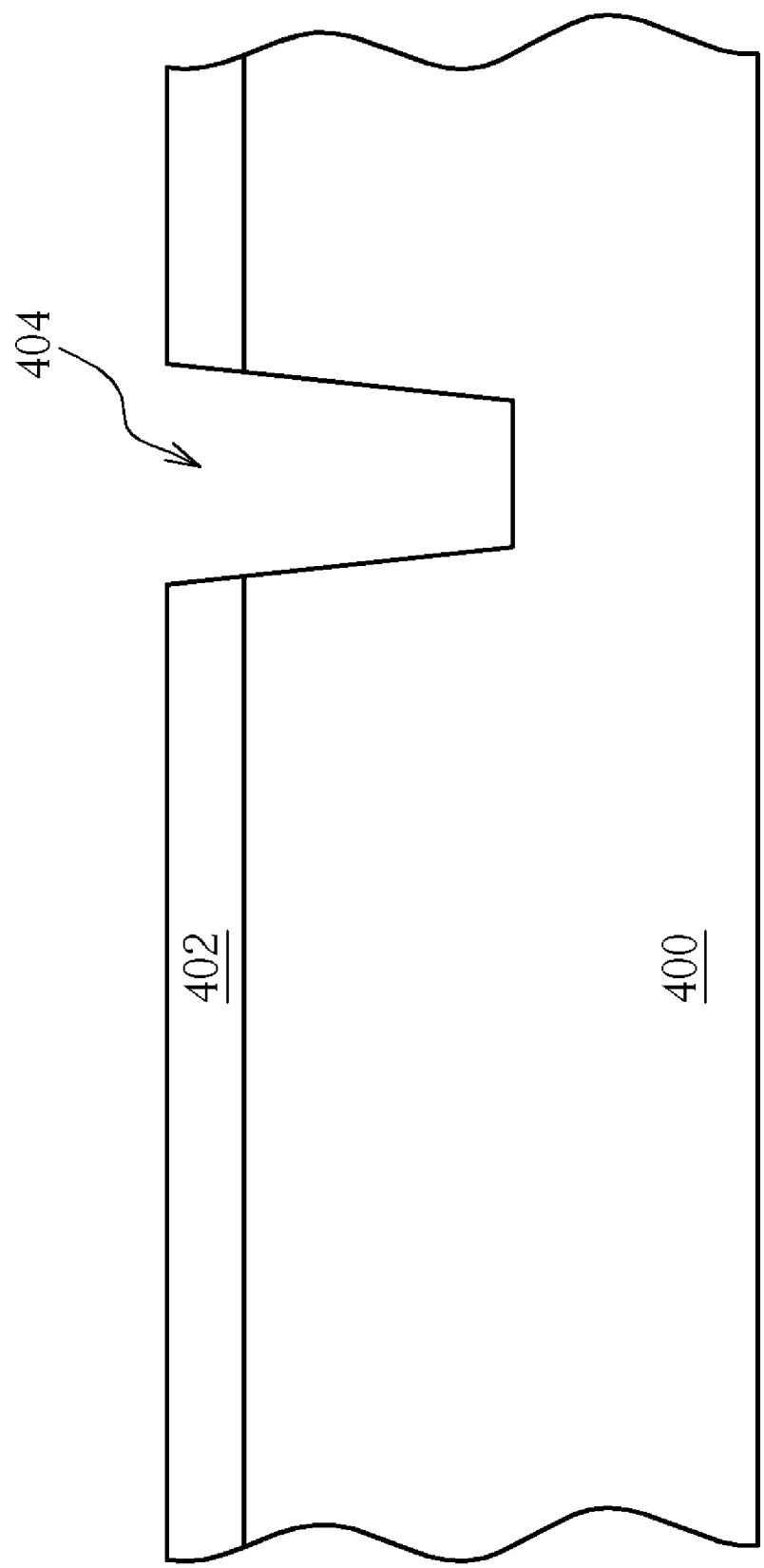
FIGS. 11-17 are schematic drawings illustrating the method for manufacturing an image sensor according to another embodiment in the present invention.

Please refer to FIGS. 11-17 which are schematic drawings illustrating the method for manufacturing an image sensor according to another embodiment in the present invention. As shown in FIG. 11, a substrate 400 is first provided and a patterned hard mask layer 402 such as a composite layer comprising a pad oxide layer and a silicon nitride layer is formed on the surface of the substrate 400 for defining a position of a shallow trench isolation (STI) 410 (shown in FIG. 12). Then a dry etching process is performed to etch the substrate 400 through the patterned hard mask layer 402 and to form a shallow trench 404 having a depth in a range of 3000-4000 angstroms.

Figure 12:
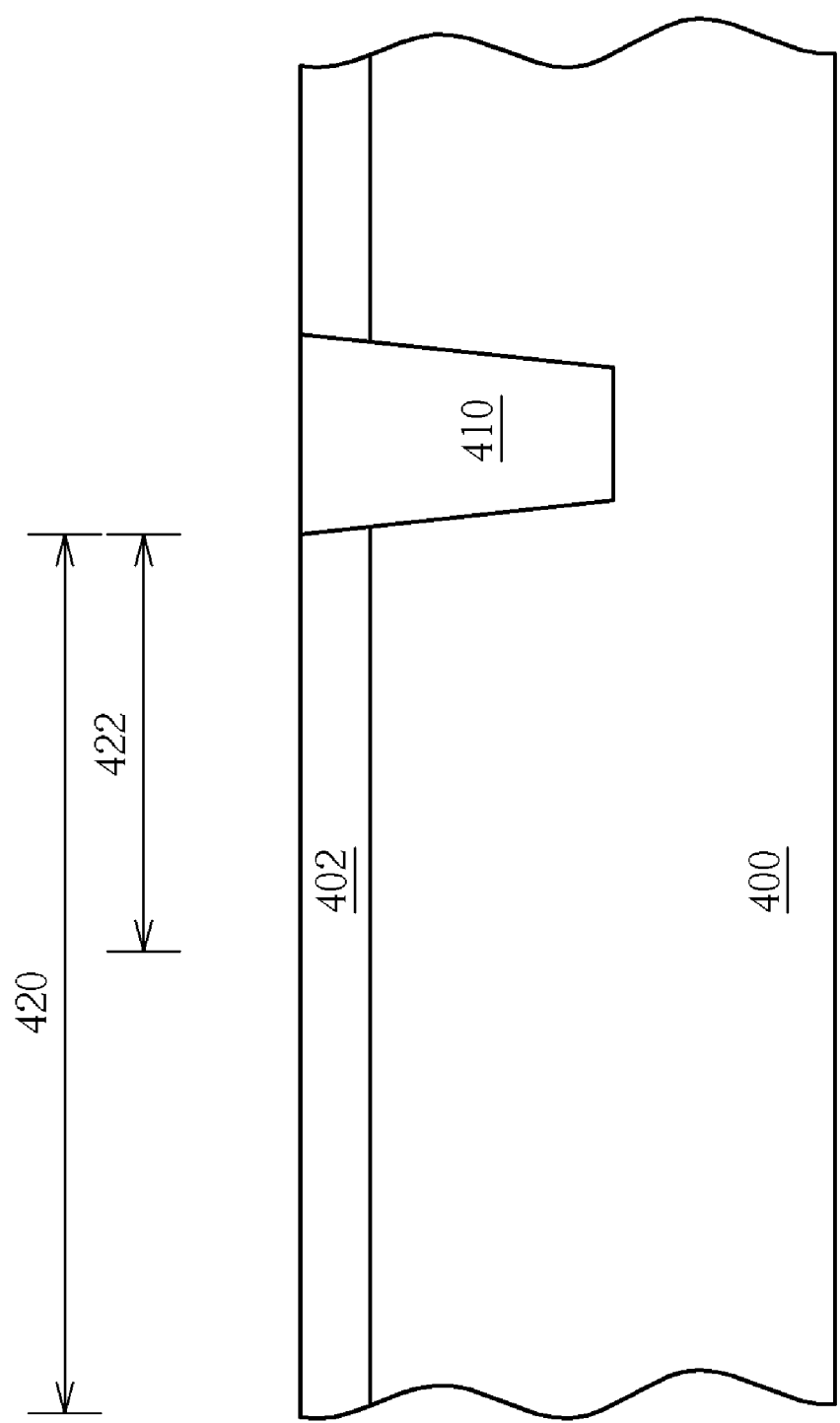

Please refer to FIG. 12. Then a thermal oxidation process, a spin-on process, or a CVD process is performed to form a dielectric layer (not shown) filling the shallow trench 404 on the substrate 400. And a CMP method is performed as a planarization process to remove the dielectric layer (not shown) from the substrate 400 and to obtain the STI 410 and a substantially even surface. The formed STI 410 defines an active area 420 which has a photo sensing region 422.

Figure 13:
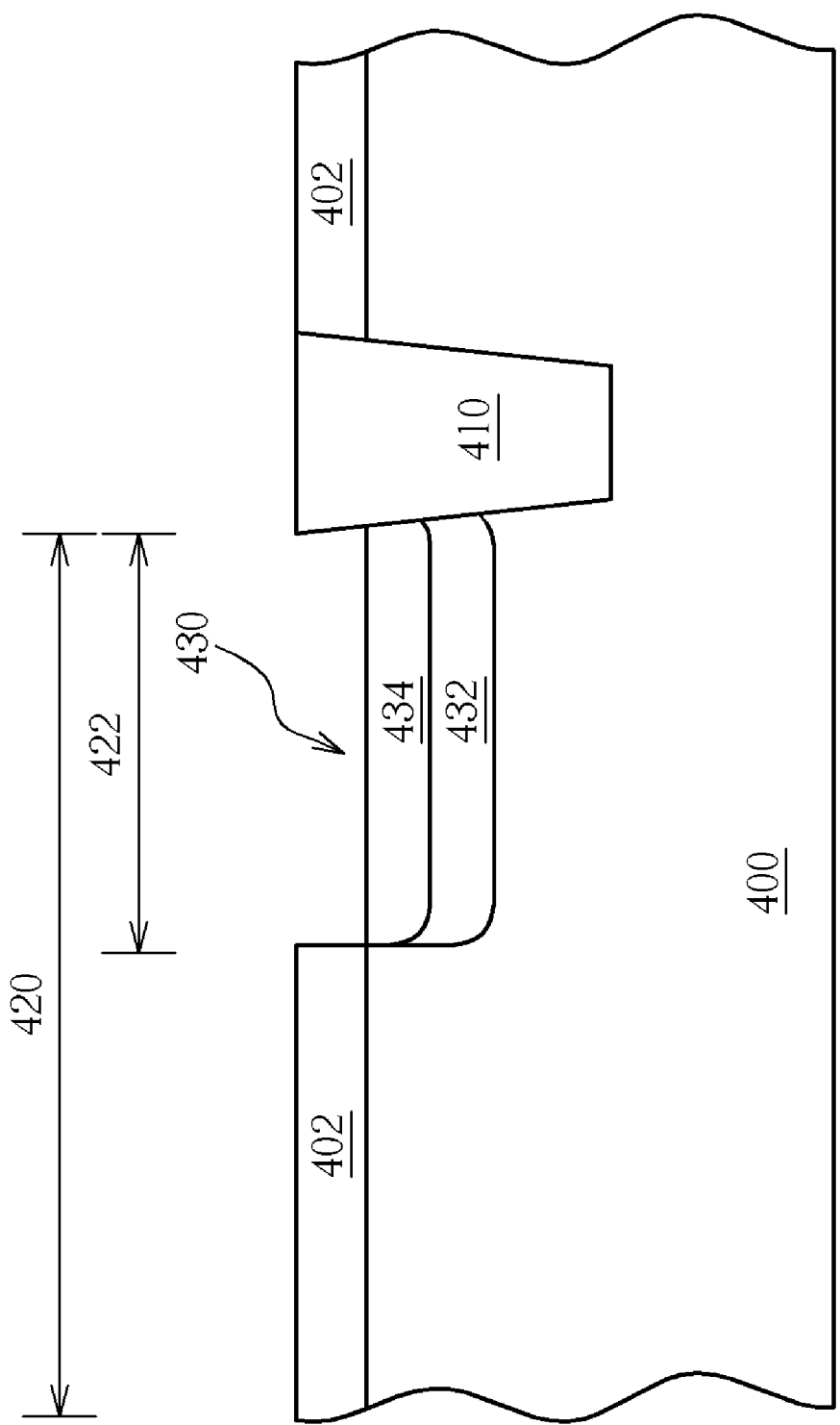

Please refer to FIG. 13. Then a photo-etching process (PEP) process is performed to remove part of the patterned hard mask layer 402 for defining a position of a photodiode 430 and a LOCOS layer (shown in FIG. 14) in the photo sensing region 422. The patterned hard mask layer 402 is also used as a mask in ion implantation processes which sequentially form a lightly doped layer 432 and a heavily doped layer 434 thereon in the photo sensing region 422. And thus a pinned photodiode 430 is formed after the ion implantation processes.

Figure 14:
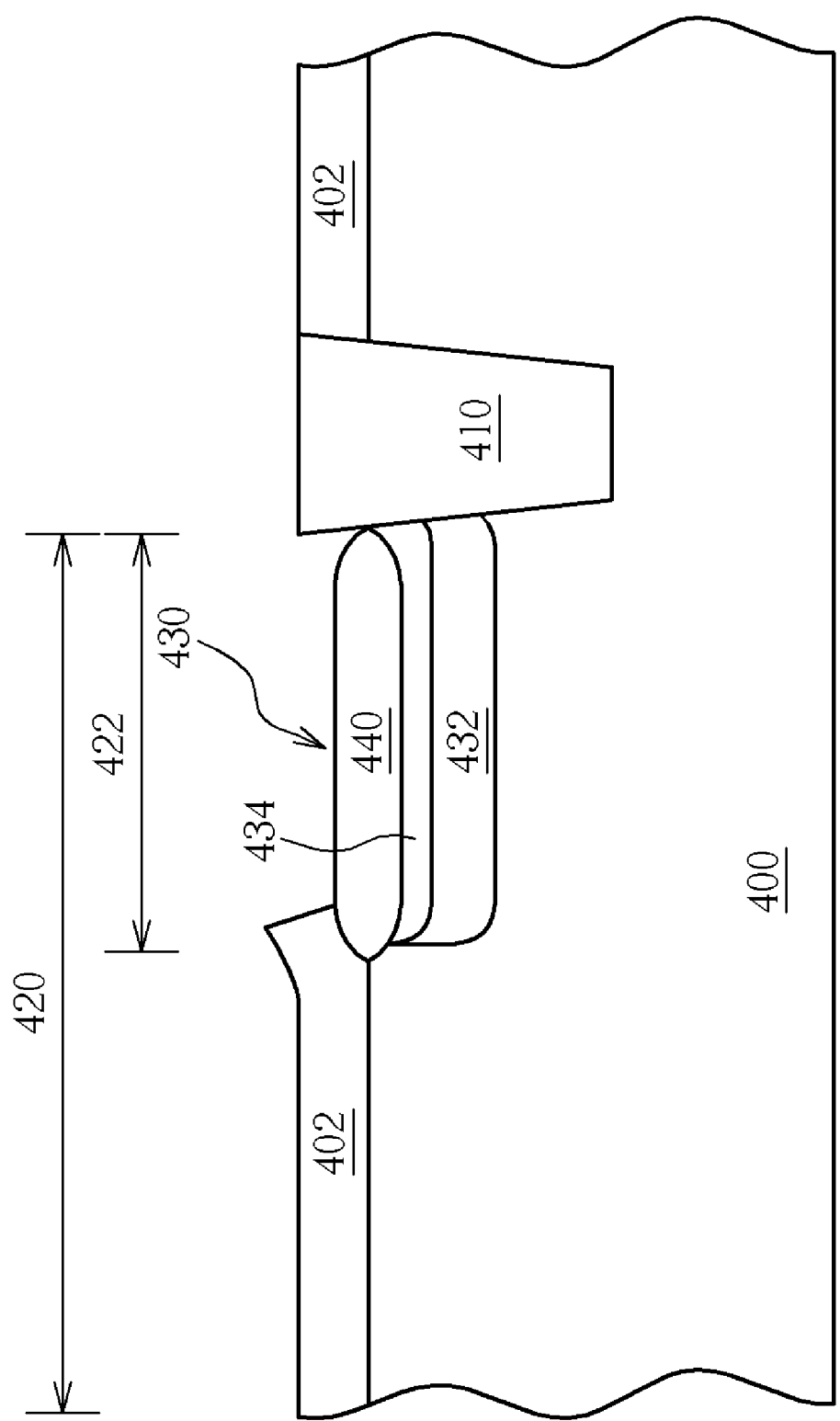
Figure 15:
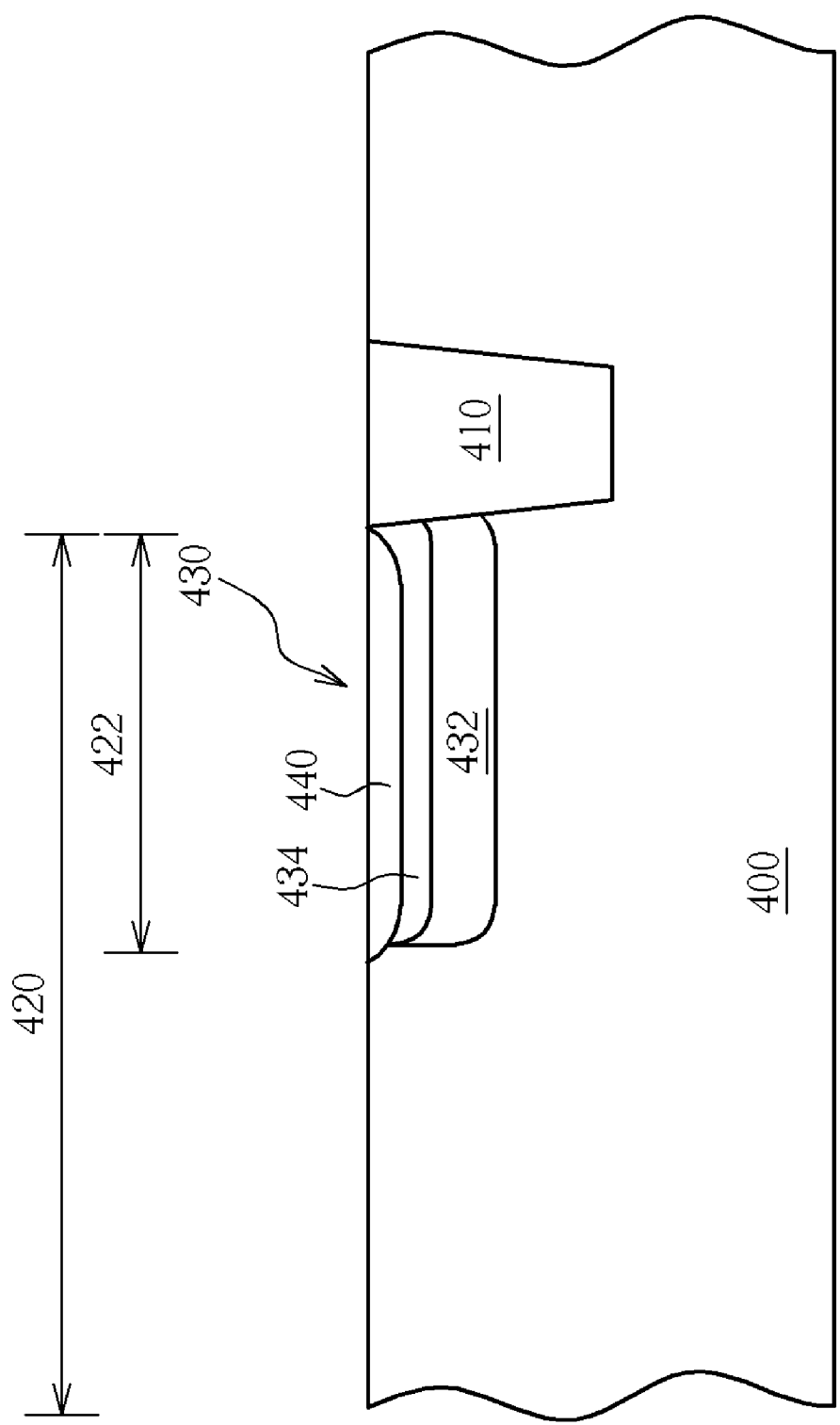

Please refer to FIGS. 14-15. After forming the photodiode 430, the patterned hard mask layer is used as a mask in a LOCOS process to form a LOCOS layer 440 covering the photodiode 430 on the substrate 400. It is noteworthy that the LOCOS layer 440 covering the photodiode 430 as its protection layer has a thickness in a range of 100-1000 angstroms. Then the patterned hard mask layer is removed from the substrate 400.

Figure 16:
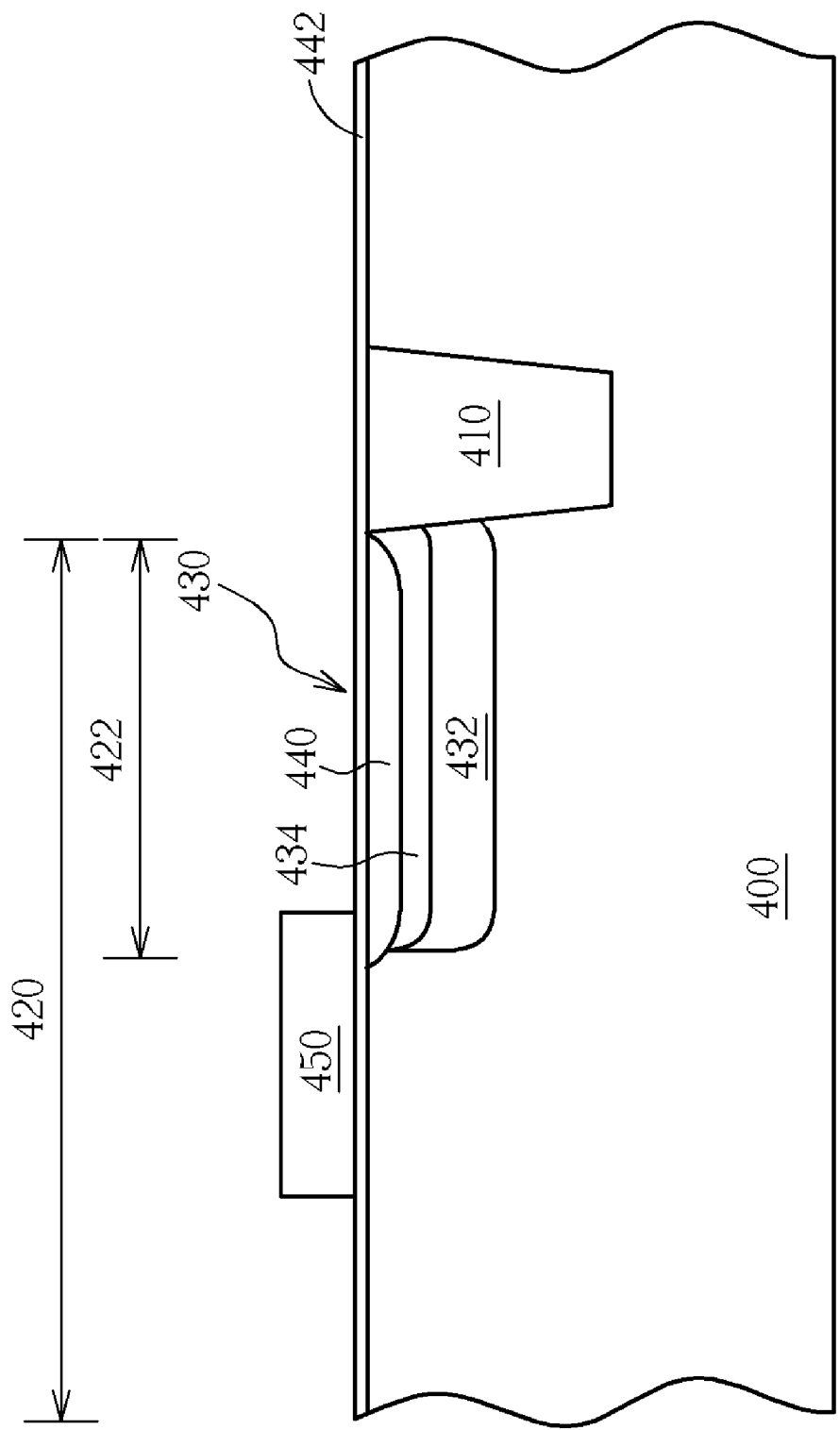
Figure 17:
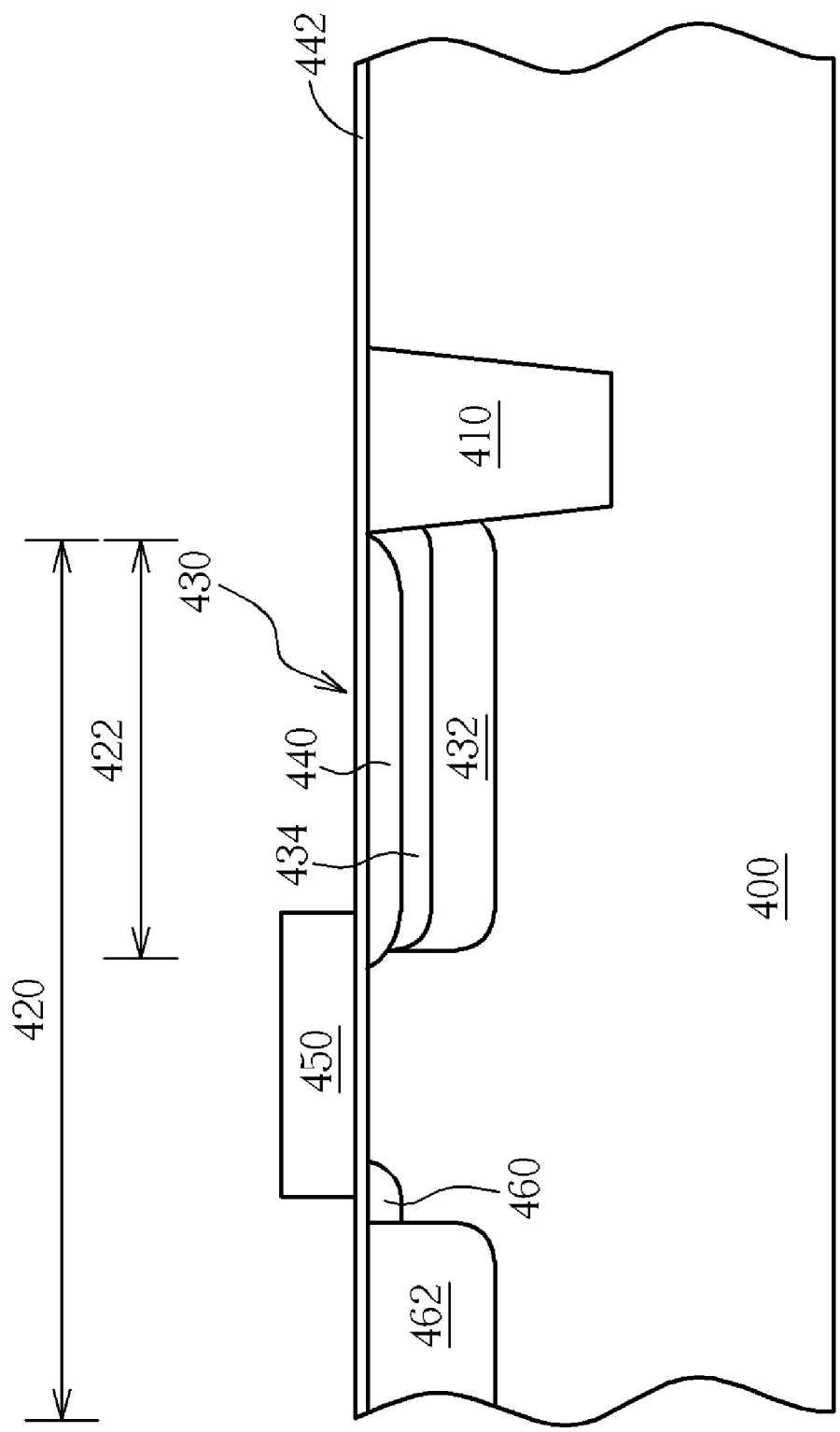

Please refer to FIGS. 16-17. Next, a thermal oxidation process or a CVD process is performed to form a dielectric layer such as an oxidation layer 442 on the substrate 400. And a gate 450 partially overlapping the LOCOS layer 440 of a transistor is formed on the substrate 400. In addition, a planarization process such as a CMP process or an etching process is selectively performed for removing impurities from the substrate 400 to obtain an oxidation layer 442 having better quality, for decreasing the thickness of the LOCOS layer 440 to improve the sensibility of the photodiode 430, and for polishing the LOCOS layer 340 to obtain an even surface. Then the gate 450 is used as a mask in ion implantation processes which sequentially form a lightly doped region 460 and a heavily doped region 462 in the substrate 400 where the gate 450 does not cover the LOCOS layer 440.

Figure 10:
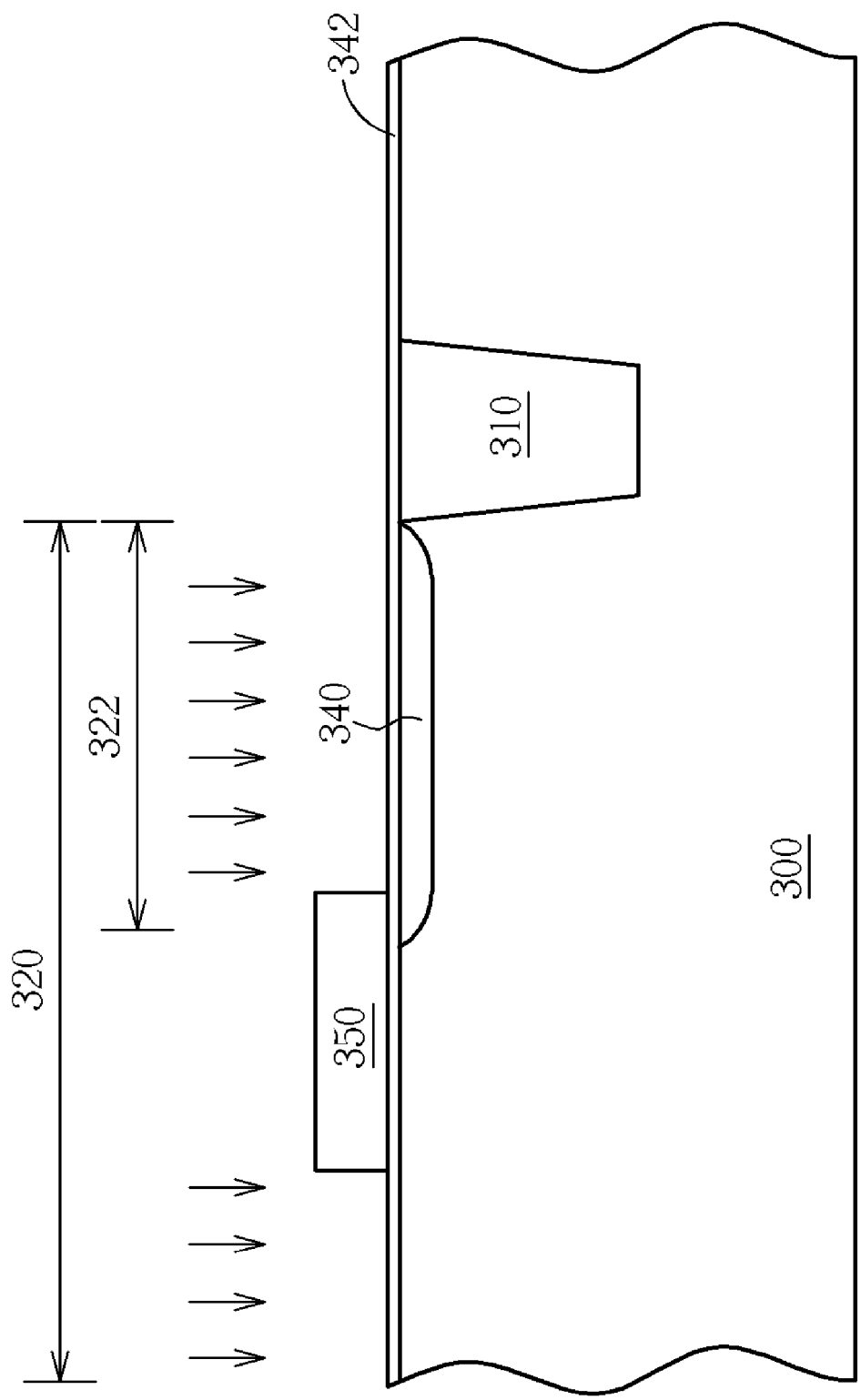

As mentioned above, although the steps of forming the photodiode 430 is performed before the LOCOS process in this embodiment, it also can be performed after the LOCOS process and before forming the gate 450. In addition, the steps of forming the photodiode 430 can be performed simultaneously with the steps of forming the lightly doped region 460 and the heavily doped region 462, or after those steps. Because the changes in the order are the same as what FIGS. 9-10 showed, the drawings are herein omitted.

Because the LOCOS layer 440 is used to be the protection layer of the photodiode 430, the surface of the photodiode 430 will not be damaged when forming the gate 450, which partially overlaps the LOCOS layer 440. Therefore dark current resulting from the damaged surface in the processes such as plasma etching is obviously reduced. In addition, because the LOCOS layer 440 and the oxidation layer 442 partially overlapping the gate 450 are used as the gate insulator and the LOCOS layer 440 is thicker than the oxidation layer 442, the gate insulator has different thickness. When the voltage applied to the gate 450 is smaller than the threshold voltage ($V_{th}$), the gate 450 is turned off immediately, therefore dark current is further effectively reduced.

The method of manufacturing an image sensor provided by the present invention can be used to manufacture a 4-transistor image sensor. It is noteworthy that because the STI and the LOCOS layer are formed separately, and the STI is used to electrically isolate the active area from each other while the LOCOS layer is used to be a protection layer for the photodiode and the gate insulator of the gate, the present invention provides an image sensor having lower occurrence of dark current without influencing the demand for the integration. Moreover, because the gate insulator has different thickness in accordance with the claimed invention, a mechanism which effectively turns off the gate is provided to further reduce the occurrence of dark current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing an image sensor comprising steps of:

providing a substrate;

forming a plurality of shallow trench isolations (STIs) for defining and isolating a plurality of active areas, each of which comprises a photo sensing region;

performing a local oxidation of silicon (LOCOS) process to form a LOCOS layer on the surface of the photo sensing region;

forming a gate of a transistor partially overlapping the LOCOS layer in each active area; and forming a plurality of doped regions in the substrate.

2. The method of claim 1, wherein the step of forming the STIs further comprises:

forming a patterned hard mask layer on the substrate for defining the positions of the STIs;

performing a dry etching process to form a plurality of shallow trenches through the patterned hard mask layer;

performing a chemical vapor deposition (CVD) process to form a dielectric layer on the substrate, the dielectric layer filling the shallow trenches; and performing a planarization process to remove the dielectric layer from the substrate.

3. The method of claim 2, further comprising a step of performing a photo-etching process (PEP) process after the planarization process to remove part of the patterned hard mask layer and define the position of the LOCOS layer.

4. The method of claim 3, further comprising a step of removing the patterned hard mask layer entirely after the LOCOS process.

5. The method of claim 4, further comprising a step of forming a dielectric layer over the substrate after removing the patterned hard mask layer.

6. The method of claim 5, wherein the dielectric layer partially overlaps the gate.

7. The method of claim 6, wherein the dielectric layer and the LOCOS layer overlapping the gate are used as a gate insulator.

8. The method of claim 2, wherein the shallow trench has a depth in a range of 3000-4000 angstroms.

9. The method of claim 1, further comprising steps of forming a photodiode in the photo sensing region, the steps comprising:

forming a lightly doped layer in the photo sensing region; and forming a heavily doped layer on the lightly doped layer.

10. The method of claim 9, wherein the steps of forming the photodiode are performed before the LOCOS process.

11. The method of claim 9, wherein the steps of forming the photodiode are performed after the LOCOS process and before forming the gate.

12. The method of claim 9, wherein the steps of forming the photodiode are performed while forming the doped regions.

13. The method of claim 9, wherein the photodiode is a pinned photodiode.

14. The method of claim 9, wherein the LOCOS layer covering the photodiode is used as its protection layer.

15. The method of claim 1, wherein the LOCOS layer has a thickness in a range of 100-1000 angstroms.

16. The method of claim 1, further comprising a step of forming a dielectric layer over the substrate after forming the LOCOS layer.

17. The method of claim 16, wherein the dielectric layer overlaps the gate for being a gate insulator.

18. The method of claim 1, wherein the LOCOS layer partially overlapping the gate is used as a gate insulator.

19. The method of claim 1, wherein the doped regions are formed in a part of the substrate where the gate does not cover the LOCOS layer.

20. The method of claim 1 being used to manufacture a 4-transistor image sensor.

21. An image sensor comprising:

a substrate;

a shallow trench isolation (STI) for defining and electrically isolating an active area on the substrate;

a photodiode formed in the active area on the substrate;

a local oxidation of silicon (LOCOS) layer covering the surface of the photodiode for protecting the surface of the photodiode;

a gate formed in the active area on the substrate and partially overlapping the LOCOS layer; and a doped region formed in the substrate.

22. The image sensor of claim 21, wherein the STI has a depth in a range of 3000-4000 angstroms.

23. The image sensor of claim 21, wherein the photodiode is a pinned photodiode.

24. The image sensor of claim 21, wherein the LOCOS layer has a thickness in a range of 100-1000 angstroms.

25. The image sensor of claim 21, further comprising a dielectric layer covering the substrate and partially overlapping the gate for being a gate insulator.

26. The image sensor of claim 25, wherein the LOCOS layer and the dielectric layer partially overlapping the gate are used as a gate insulator.

27. The image sensor of claim 21, wherein the doped region is formed in a part of the substrate where the gate does not cover the LOCOS layer.

28. The image sensor of claim 21, wherein the image sensor is a 4-transistor image sensor.

* * * * *